United States Patent [19]
Lin

[11] Patent Number: 5,722,767
[45] Date of Patent: Mar. 3, 1998

[54] LED DISPLAY PANEL STRUCTURE

[75] Inventor: Sharming Lin, Taipei, Taiwan

[73] Assignee: Formosa Industrial Computing Inc., Taipei, Taiwan

[21] Appl. No.: 735,261

[22] Filed: Oct. 22, 1996

[51] Int. Cl.$^6$ .................................... F21V 31/02
[52] U.S. Cl. ..................... 362/249; 362/267; 362/800
[58] Field of Search ......................... 362/227, 236, 362/249, 267, 306, 369, 390, 800, 812; 313/318.08, 500, 510, 512; 40/578, 579

[56] References Cited

U.S. PATENT DOCUMENTS

| | | | |
|---|---|---|---|
| 4,599,682 | 7/1986 | Stephens | 362/800 |
| 4,600,977 | 7/1986 | Barlian et al. | 362/267 |
| 4,742,432 | 5/1988 | Thillays et al. | 362/800 |
| 4,860,177 | 8/1989 | Simms | 362/800 |
| 5,066,889 | 11/1991 | Edwards | 313/512 |
| 5,278,734 | 1/1994 | Ferber | 362/800 |
| 5,400,228 | 3/1995 | Kao | 362/249 |
| 5,400,229 | 3/1995 | Lin | 362/249 |

*Primary Examiner*—Alan Cariaso
*Attorney, Agent, or Firm*—Martin Korn

[57] ABSTRACT

An LED display panel structure comprises a PC board, a front plate having a plurality of through-holes defined thereon, a plurality of washers, each of which is provided on a back surface of the front plate in correspondence with each of the through-holes, a plurality of LEDs, each of which is inserted through a central aperture of each of the washers being smaller than a diameter of the LED to be clamped therein, and a plurality of holders, each of which has a first recess and a second recess, each of the holders receives and holds each of the LEDs in its first recess and is attached on the PC board by water resistant adhesive filled in the second recess. A pair of through-bores communicating the first recess with the second recess are defined therebetween to allow a pair of leads of each of the LEDs to extend therethrough and connect to the PC board. Such a structure can prevent moisture from seeping in to damage the LEDs.

7 Claims, 3 Drawing Sheets

LED DISPLAY PANEL STRUCTURE

BACKGROUND OF THE INVENTION

1. Field of the Invention

The present invention relates to an LED display panel, more particularly, to an LED display panel structure with high water resistance.

2. Description of Related Art

LED display panels are widely used now throughout the world in all manner of situations. For example, it is used as an informational sign for showing traffic condition, or as a bill board for publicizing merchandise.

A conventional LED display panel as shown in FIG. 4 includes a casing 72, a PC board 70 supported on the casing 72, a plurality of LEDs 71 provided on the board 70, and a transparent acrylic plate 73 provided in front of the LEDs 71. However, there is always a gap existing between respective edges of the acrylic plate 73 and the PC board 70, so it is possible that moisture seeps into a space defined therebetween via the gap, resulting in a mist on the acrylic plate 73, whereby causing a degradation for visibility of the display panel.

In addition, there is a reflection phenomenon due to acrylic plate 73, resulting in a reduced contrast of the. LEDs 71, so the visibility of the display panel is degraded accordingly. A conventional method used to overcome this problem is to increase a current passing through the LEDs 71, so as to enhance light intensity thereof. However, such a manner using a large current causes a diminution of life-time of an LED.

Furthermore, the LEDs 71 are inserted on the PC board 70 directly, however, it is difficult for the LEDs 71 to be secured on the board 70 by such a manner. An inclination often occurs to some of the LEDs 71 when the display panel is subjected to an external force, and therefore resulting in negative influence on the visibility of the display panel. In addition, a space between the acrylic plate 73 and the LEDs 71 is very small because the LEDs 71 are inserted on the PC board 70 directly. The space is not sufficient for dissipating a heat due to a process of passing the display board through a tinning machine, and therefore resulting in a disadvantageous effect on the LEDs.

SUMMARY OF THE INVENTION

One object of the present invention is to provide an improved LED display panel structure having high water resistance to prevent the LEDs arranged on the display panel from being damaged by moisture and avoid degradation of visibility of the display panel.

Another object of the present invention is to provide an improved LED display panel structure, which presents good heat dissipation effect, and therefore increasing the life-time of each LED.

A further object of the present invention is to provide an improved LED display panel structure, which can avoid inclination of the LEDs disposed on the display panel to maintain the visibility thereof at a certain level.

In accordance with one aspect of the present invention, the LED display panel structure comprises a PC board, a front plate having a plurality of through-holes defined thereon, a plurality of washers, each of which is provided on a back surface of the front plate in correspondence to each of the through-holes, a plurality of LEDs, each of which is inserted into a central aperture of each of the washers and the corresponding through-hole to be secured therein, and a plurality of holders having a first recess and a second recess applied with water resistant adhesive, each of which holds each of the LEDs in its first recess and is disposed on the PC board, thereby preventing moisture from seeping to damage the LED.

In accordance with another aspect of the present invention, the heat dissipation effect of the LED display panel can be improved since the holder holding the LED and being disposed on the PC board allows the LED not to be disposed on the PC board directly so as to provide a spacing between the LEDs and the PC board, and there is no need for an acrylic plate to be provided in front of the LEDs. Accordingly, the LED can be protected from being damaged by heat when the PC board is processed by a tinning machine.

In accordance with a further aspect of the present invention, the LED display panel structure further comprises a plurality of supports for fixing the PC board with the front plate to secure the holder holding the LED, so as to prevent the inclination of the LED.

Other objects, advantages and novel features of the invention will become more apparent from the following detailed description when taken in conjunction with the accompanying drawings.

DETAILED DESCRIPTION OF PREFERRED EMBODIMENT

Figure 1:
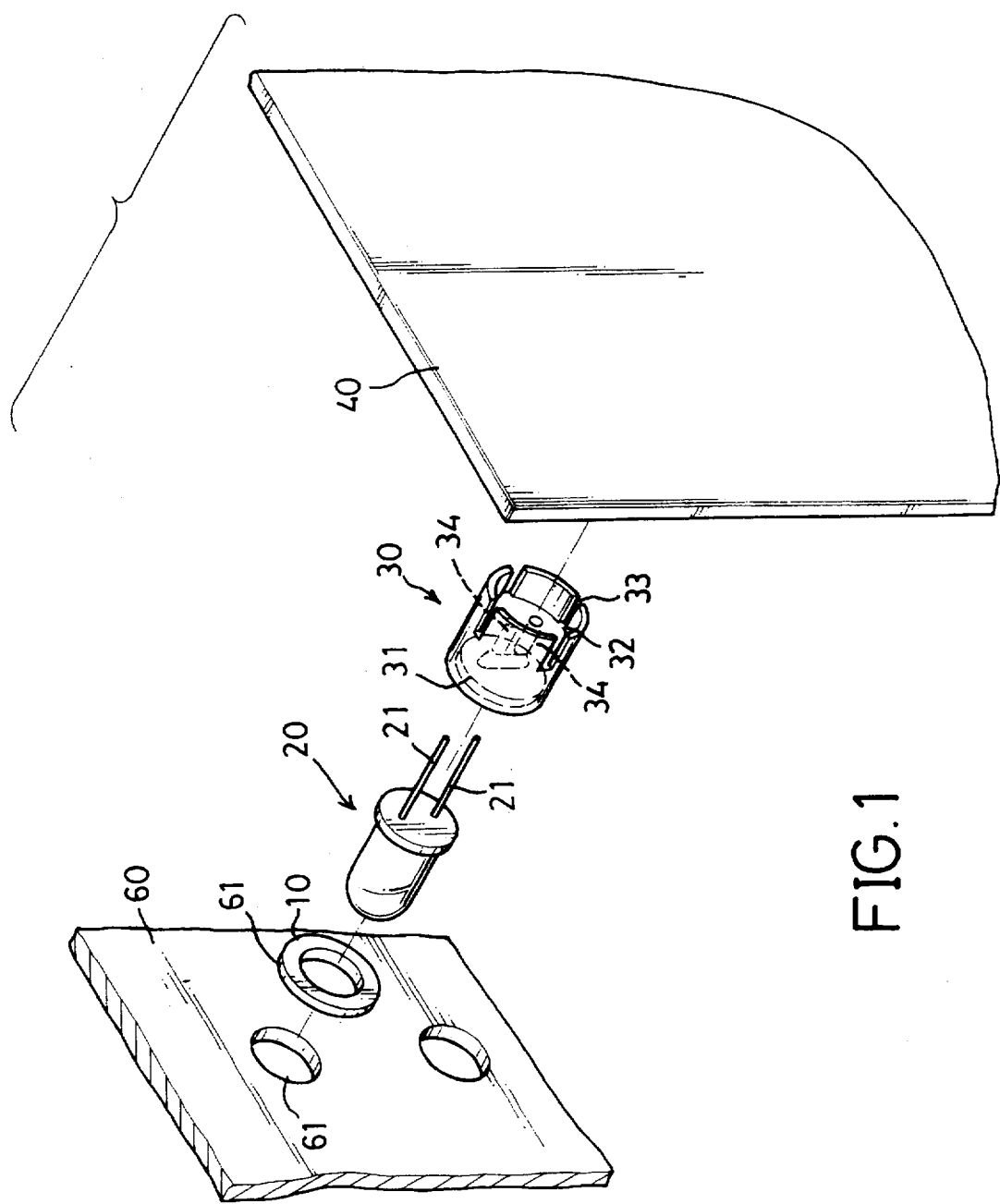
FIG. 1 is an exploded view showing the main portions of the LED display panel structure in accordance with the present invention.

Now referring to FIG. 1, the LED display panel structure comprises a front plate 60, which has a plurality of through-holes 61 defined therein, each of the through-holes 61 being correspondingly provided with a washer 10 at the back side of the front plate 60, a plurality of LEDs (light emitting diodes) 20, each having two leads 21 extending from a body thereof, wherein a respective LED is inserted into a central aperture of the washer 10 and the corresponding through-hole 61. The LED 20 is clamped securely by the washer 10, since the aperture of the washer 10 is slightly smaller than a diameter of the LED 20. By such a matter, the LED 20 can be tightly and firmly combined With the washer 10, and therefore preventing water such as moisture from seeping in to damage the LED.

Figure 2:
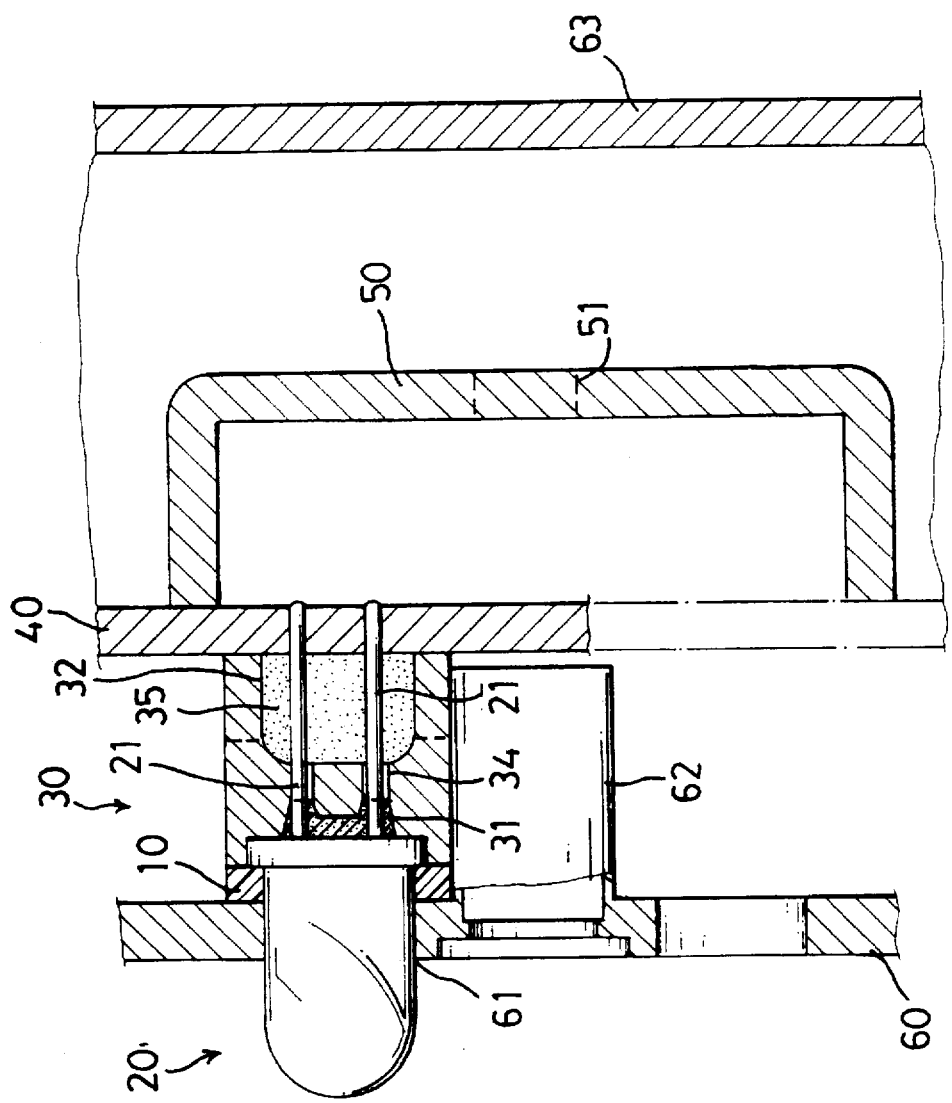
FIG. 2 is a sectional sideview showing the configuration of the LED display panel structure in accordance with the present invention.
Figure 4:
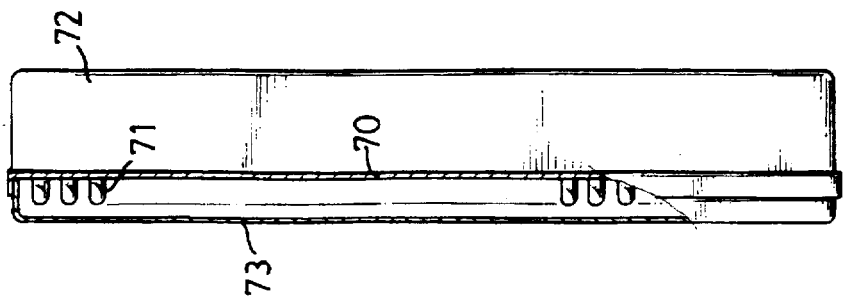
FIG. 4 is a side view, partly in cross-section, showing a conventional LED display panel.

As shown in FIG. 1, a holder 30 having a first recess 31 and a second recess 32 is provided to receive and hold each of the LEDs 20 in the first recess 31 thereof, wherein a pair of through-bores 34 communicating the first recess 31 with the second recess 32 are defined therebetween, as shown in FIG. 1 and FIG. 2, to allow the two leads 21 to extend therethrough, respectively. The LED 20 is applied with water resistant adhesive at a portion where the leads extend therethrough before being held in the first recess 31 of the holder 30. There are a plurality of slits 33 defined on the peripheral wall around the second recess 32 as shown. The second recess 32 and the slits 33 are filled with water resistant adhesive 35 (see FIG. 2), and then each of the holders 30 holding the LED 20, which is clamped by the washer 10, is combined to a PC board 40, and the two leads of each of the LEDs are accordingly connected thereto. The structure formed as above can effectively prevent the leads of each of the LEDs from being contacted by moisture, that is, it exhibits a good water resistance.

Since each of the LEDs 20 is held in each of the holders 30 and then secured on the PC board 40 rather than directly secured thereto as in prior art, thus there exists a spacing between the LED 20 and the PC board 40. Therefore, the LED is not subjected to heat when the PC board 40 is processed by a tinning machine, so as to maintain the life-time of the LED.

Figure 3:
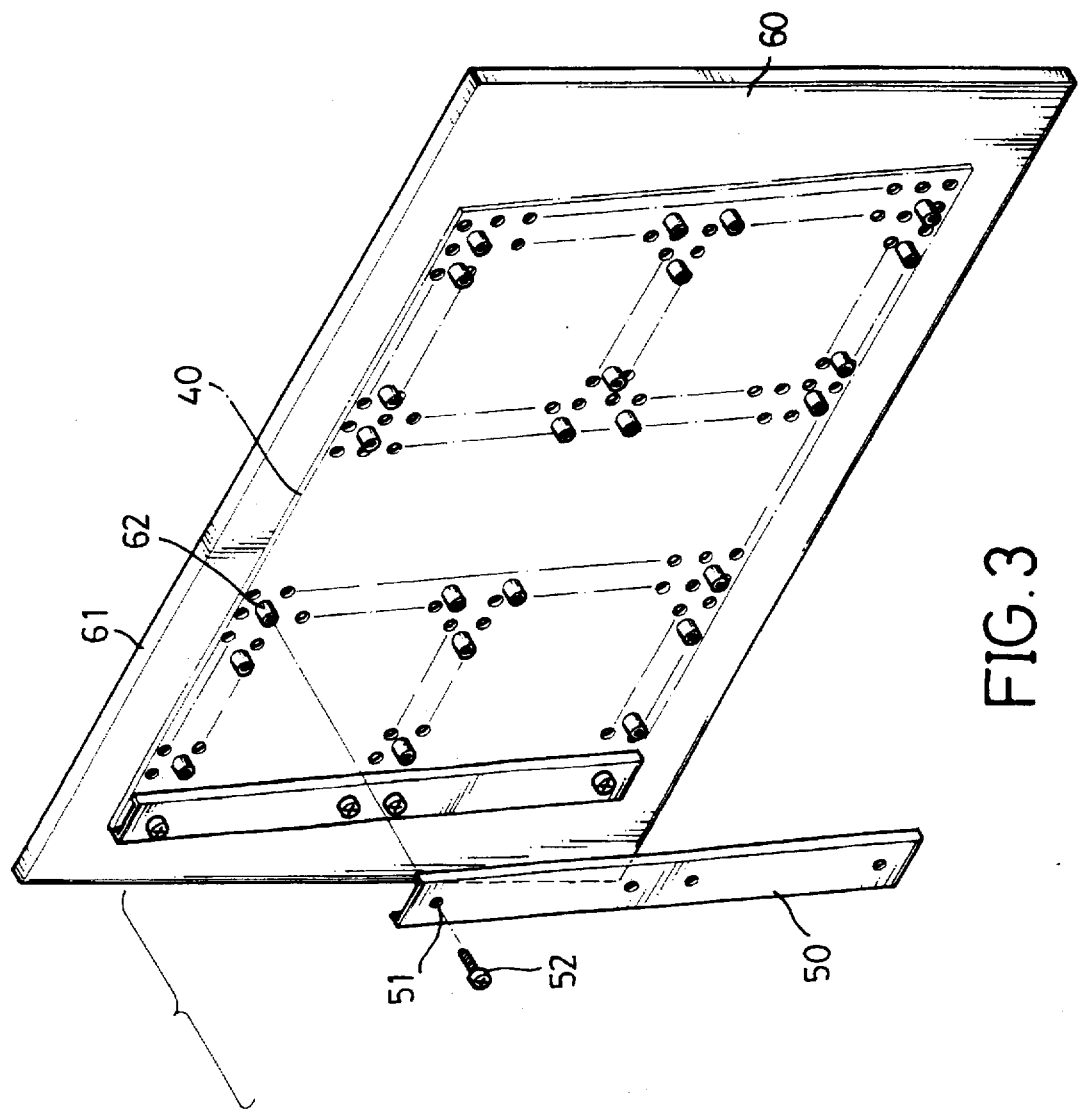
FIG. 3 is a rear perspective view showing a support fixed on a PC board and another support to be fixed thereon.

Furthermore, a support 50 having a plurality of bores 51 defined thereon is fixed to the PC board 40 by a bolt 52 extending through each of the bores 51 and a respective corresponding bore 41 in the PC board 40, and then secured to the front plate 60 by the same bolt 52 threadedly engaging with a projection 62 with threaded bore defined inside provided on the front plate 60, as shown if FIG. 3. As a result, the front plate 60 and the PC board 40 are secured together with each of the holders 30 holding each of the LEDs 20 sandwiched therebetween, and therefore preventing the LEDs 20 from unintentional inclination. In addition, the result structure can be provided in a casing 63, as shown in FIG. 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED display panel structure comprising:

a front plate having a plurality of through-holes defined therein;

a plurality of washers, each being provided on a back surface of said front plate in correspondence to each of said through-holes;

a plurality of LEDs each having a body and two leads, each of said LEDs being inserted into an aperture defined inside each of said washers and clamped in said aperture;

a plurality of holders, each having a first recess for receiving and holding each of said LEDs and a second recess for being filled with water resistant adhesive, a pair of through-bores which communicate said first recess with said second recess being defined for said pair of leads of each LED to extend therethrough respectively; and a PC board for being attached by each of said holders with said second recess filled with water resistant adhesive and being connected with said two leads of each of said LEDs.

2. The LED display panel structure according to claim 1, wherein said aperture of each of said washers is slightly smaller than a diameter of each of said LEDs.

3. The LED display panel structure according to claim 1, wherein water resistant adhesive is also applied between said body of each of said LED and said first recess of each of said holders.

4. The LED display panel structure according to claim 1, further comprising:

a plurality of supports each having a plurality of bores, said supports supporting on a back surface of said PC board by a bolt extending through respective bore of each of said supports and respective corresponding bore of said PC board and then being secured to said front plate while each of said holders holding each of said LEDs being sandwiched between said PC board and said front plate.

5. The LED display panel structure according to claim 4, wherein each of said supports is formed as U-shaped.

6. The LED display panel structure according to claim 4, wherein said front plate is provided with a plurality of projections each having a threaded bore defined inside for each of said bolts to extend and secure into.

7. The LED display panel structure according to claim 1, wherein each of said holders has a plurality of slits defined in a peripheral wall around said second recess.

* * * * *